US008106725B2

(12) United States Patent
Takamine (10) Patent No.: US 8,106,725 B2
(45) Date of Patent: Jan. 31, 2012

(54) ACOUSTIC WAVE FILTER DEVICE (75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/086,447

(22) Filed: Apr. 14, 2011

(65) Prior Publication Data
US 2011/0187479 A1 Aug. 4, 2011

Related U.S. Application Data (63) Continuation of application No. PCT/JP2009/003568, filed on Jul. 29, 2009.

(30) Foreign Application Priority Data

Nov. 25, 2008 (JP) .................................. 2008-299490

(51) Int. Cl.
*H03H 9/64* (2006.01)
*H03H 9/54* (2006.01)

(52) U.S. Cl. ...... 333/193; 333/194; 333/187; 310/313 B (58) Field of Classification Search .................. 333/187, 333/189, 193–196; 310/313 B, 313 D
See application file for complete search history.

(56) References Cited

U.S. PATENT DOCUMENTS

| 6,771,145 | B2 * | 8/2004 | Ouchi et al. | 333/195 |
|---|---|---|---|---|
| 7,388,456 | B2 * | 6/2008 | Furusato et al. | 333/193 |
| 2002/0163403 | A1 * | 11/2002 | Sawada et al. | 333/195 |
| 2004/0000842 | A1 | 1/2004 | Yata | |
| 2009/0051457 | A1 * | 2/2009 | Bauer et al. | 333/4 |
| 2009/0289745 | A1 * | 11/2009 | Bauer et al. | 333/195 |

FOREIGN PATENT DOCUMENTS

| JP | 2000-349589 | * | 12/2000 |
|---|---|---|---|
| JP | 2003-152502 | * | 5/2003 |
| JP | 2003-273707 A | | 9/2003 |
| JP | 2004-260402 A | | 9/2004 |
| JP | 2008-118277 A | | 5/2008 |
| WO | 2008/108113 A1 | | 9/2008 |
| WO | 2008/126473 A1 | | 10/2008 |

OTHER PUBLICATIONS

Official Communication issued in International Patent Application No. PCT/JP2009/003568, mailed on Sep. 15, 2009.

* cited by examiner

*Primary Examiner* — Barbara Summons
(74) *Attorney, Agent, or Firm* — Keating & Bennett, LLP (57) ABSTRACT

An acoustic wave filter device includes longitudinally coupled resonator-acoustic wave filters having a balanced-unbalanced conversion function, and increases the amount of attenuation in an attenuation band and improves the isolation characteristics when the acoustic wave filter device is used as a reception filter of a duplexer. The acoustic wave filter device includes an unbalanced terminal, first and second balanced terminals, first and second longitudinally coupled resonator-acoustic wave filters that are connected between the unbalanced terminal and the first balanced terminal and between the unbalanced terminal and the second balanced terminal, respectively, a first parallel resonator connected between the first balanced terminal and a ground potential, and a second parallel resonator connected between the second balanced terminal and the ground potential. The electrostatic capacitance of the first parallel resonator is different from the electrostatic capacitance of the second parallel resonator. Among the first parallel resonator and the second parallel resonator, the wavelength of the first parallel resonator having a relatively small electrostatic capacitance is shorter than the wavelength of the second parallel resonator having a relatively large electrostatic capacitance.

9 Claims, 7 Drawing Sheets

FIG. 11
PRIOR ART

ACOUSTIC WAVE FILTER DEVICE

BACKGROUND OF THE INVENTION

1. Field of the Invention

The present invention relates to acoustic wave filter devices used in, for example, bandpass filters of mobile communication systems. More particularly, the present invention relates to a longitudinally coupled resonator-acoustic wave filter device having a balanced-unbalanced conversion function.

2. Description of the Related Art

Duplexers used in radio-frequency circuits in mobile phones are required to reduce the insertion loss in pass bands and to increase the amount of attenuation in attenuation bands near the pass bands. In addition, reception filters of the duplexers are required to have the balanced-unbalanced conversion function because of a reduction in the number of parts in the duplexers.

In order to satisfy such requirements, longitudinally coupled resonator-surface acoustic wave filters having the balanced-unbalanced conversion function are used as the reception filters of the duplexers.

Figure 11:
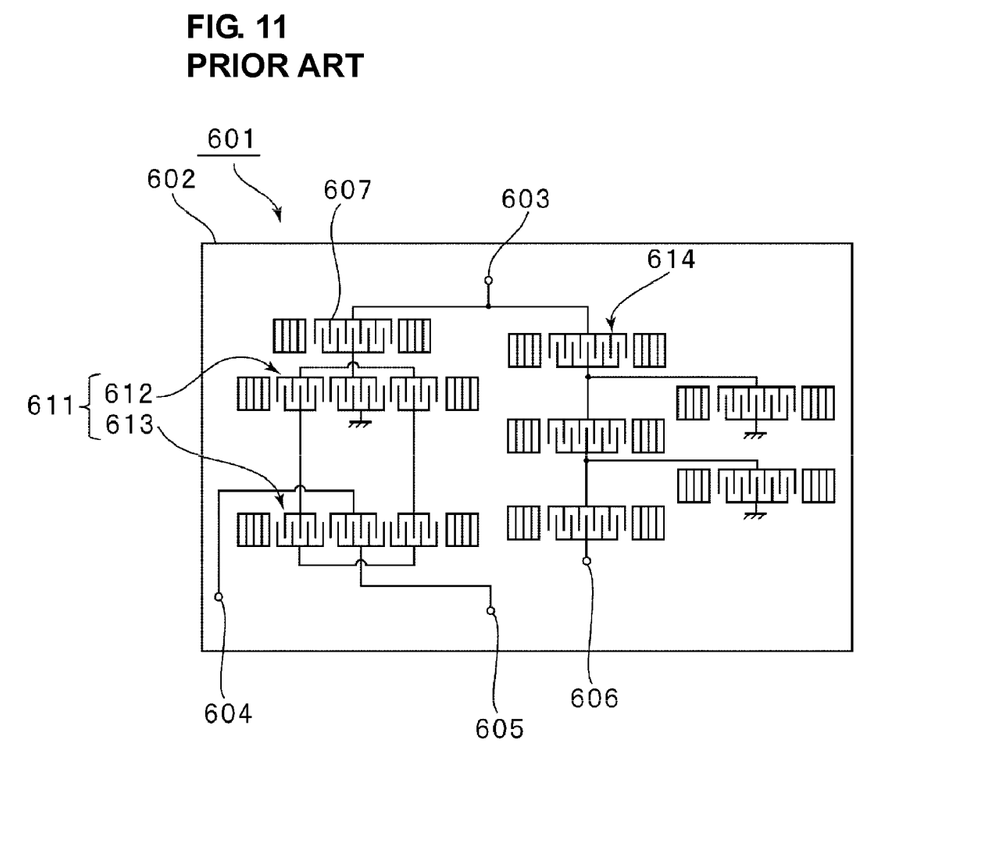
FIG. 11 is a schematic plan view for describing a surface acoustic wave filter device in related art.

Japanese Unexamined Patent Application Publication No. 2008-118277 described below discloses a duplexer including such a surface acoustic wave filter device. FIG. 11 is a schematic plan view for describing the structure of electrodes in the duplexer described in Japanese Unexamined Patent Application Publication No. 2008-118277.

In a duplexer 601, the structure of electrode shown in FIG. 11 is formed on a piezoelectric substrate 602. A longitudinally coupled resonator-surface acoustic wave filter unit 611 and a series resonator 607 connected in series to the longitudinally coupled resonator-surface acoustic wave filter unit 611 are connected between an unbalanced terminal 603, which is an antenna terminal connected to an antenna, and first and second balanced terminals 604 and 605, which are reception terminals. The longitudinally coupled resonator-surface acoustic wave filter unit 611 and the series resonator 607 form a reception filter. The longitudinally coupled resonator-surface acoustic wave filter unit 611 is a two-stage surface acoustic wave filter in which three-interdigital electrode transducer (IDT)-type longitudinally coupled resonator-surface acoustic wave filters 612 and 613 are cascaded to each other. The series resonator 607 is composed of a one-port surface acoustic wave resonator.

In contrast, a transmission filter 614 is connected between the unbalanced terminal 603, which is an antenna terminal, and a transmission terminal 606. The transmission filter 614 is composed of a ladder-type surface acoustic wave filter. Specifically, multiple surface acoustic wave resonators are connected to each other so as to have a ladder circuit configuration.

The duplexer 601 is a Universal Mobile Telecommunications System (UMTS)-BAND 8 duplexer and is used in a mobile phone. In the UMTS-BAND 8, the transmission pass band is from 880 MHz to 915 MHz and the reception pass band is from 925 MHz to 960 MHz. Since the frequency interval between the transmission pass band and the reception pass band is 10 MHz, the transmission pass band is close to the reception pass band. Accordingly, the reception filter of the duplexer 601 is required to have a larger amount of attenuation in the transmission pass band and to be excellent in sharpness of the filter characteristics. For this reason, the reception filter of the duplexer 601 uses the longitudinally coupled resonator-surface acoustic wave filter unit 611 having the two-stage structure in which the two longitudinally coupled resonator-surface acoustic wave filters 612 and 613 are cascaded to each other in order to increase the amount of attenuation in an attenuation band at a lower side of the pass band, which is the transmission pass band.

In addition, the series resonator 607 is connected in series to the longitudinally coupled resonator-surface acoustic wave filter unit 611 in the reception filter of the duplexer 601 because it is required to have a larger amount of attenuation in the attenuation band near the pass band. The resonant frequency of the series resonator 607 is positioned within the pass band of the reception filter and the anti-resonant frequency of the series resonator 607 is positioned within an attenuation band at a higher side of the pass band of the reception filter. The presence of the series resonator 607 allows the amount of attenuation in the attenuation band at the higher side of the pass band to be increased. In addition, parallel resonators may be connected between the unbalanced terminal 603 and a ground potential and between either of the first and second balanced terminals 604 and 605 and the ground potential, that is, the parallel resonators may be connected in parallel to the longitudinally coupled resonator-surface acoustic wave filter unit 611. In this case, the resonant frequency of the parallel resonators is positioned within the attenuation band at the lower side of the pass band of the reception filter and the anti-resonant frequency of the parallel resonators is positioned within the pass band of the reception filter. The presence of the parallel resonators allows the amount of attenuation in the attenuation band at the lower side of the pass band to be increased.

In structures in which multiple longitudinally coupled resonator-acoustic wave filters are cascaded to each other in acoustic wave filter devices, such as surface acoustic wave filter devices and boundary acoustic wave filter devices, the amount of attenuation in the attenuation band near the pass band is increased. However, the structures have a problem in that the insertion loss within the pass band is increased.

In order to decrease the insertion loss within the pass band, one-stage acoustic wave filter devices should be used, instead of the multi-stage acoustic wave filter devices in which multiple longitudinally coupled resonator-acoustic wave filters are cascaded to each other. However, with the one-stage acoustic wave filter devices, it is difficult to ensure a larger amount of attenuation in the attenuation band near the pass band. Accordingly, it is difficult to ensure both of the reduction in the insertion loss within the pass band and the increase in the amount of attenuation in the attenuation band near the pass band.

In contrast, as described above, the series resonator or the parallel resonator can be connected to the longitudinally coupled resonator-surface acoustic wave filter to increase the amount of attenuation in the attenuation band near the pass band and to improve the sharpness of the filter characteristics. However, when an acoustic wave filter device including a longitudinally coupled resonator-acoustic wave filter having the balanced-unbalanced conversion function and first and second parallel resonators connected between the respective first and second balanced terminals and the ground potential is used as the reception filter of a duplexer, the amount of attenuation in the transmission pass band can be decreased and/or the isolation can be apt to degrade, compared with a two-stage acoustic wave filter device in which two longitudinally coupled resonator-surface acoustic wave filters are cascaded to each other.

SUMMARY OF THE INVENTION

Preferred embodiments of the present invention an acoustic wave filter device that has a circuit configuration in which parallel resonators are connected in parallel to longitudinally coupled resonator-acoustic wave filters having an balanced-unbalanced conversion function, that has a larger amount of attenuation in the attenuation band near the pass band, and that improves the isolation characteristics when the acoustic wave filter device is used as the reception filter of a duplexer.

According to a preferred embodiment of the present invention, an acoustic wave filter device includes an unbalanced terminal; first and second balanced terminals; longitudinally coupled resonator-acoustic wave filters that are connected between the unbalanced terminal and the first balanced terminal and between the unbalanced terminal and the second balanced terminal and that has a balanced-unbalanced conversion function; a first parallel resonator connected between the first balanced terminal and a ground potential; and a second parallel resonator connected between the second balanced terminal and the ground potential. The electrostatic capacitance of the first parallel resonator is different from the electrostatic capacitance of the second parallel resonator. Among the first and second parallel resonators, the wavelength of the parallel resonator having a relatively small electrostatic capacitance is shorter than the wavelength of the parallel resonator having a relatively large electrostatic capacitance.

In a specific aspect of the acoustic wave filter device according to a preferred embodiment of the present invention, each of the longitudinally coupled resonator-acoustic wave filters preferably is a one-stage longitudinally coupled resonator-acoustic wave filter. In this case, since the one-stage longitudinally coupled resonator-acoustic wave filter is preferably used, it is possible to decrease the insertion loss.

In another specific aspect of the acoustic wave filter device according to a preferred embodiment of the present invention, each of the first and second parallel resonators preferably includes a one-port acoustic wave resonator including an IDT electrode. In this case, since the first and second parallel resonators can be formed concurrently with the longitudinally coupled resonator-acoustic wave filters in the same process, it is possible to simplify the manufacturing process. In addition, since the longitudinally coupled resonator-acoustic wave filters and the first and second parallel resonators can be provided on the same piezoelectric substrate, it is possible to decrease the number of components and to reduce the size.

In another specific aspect of the acoustic wave filter device according to a preferred embodiment of the present invention, the IDT electrode in the first parallel resonator is differentiated from the IDT electrode in the second parallel resonator so that the electrostatic capacitance of the first parallel resonator is differentiated from the electrostatic capacitance of the second parallel resonator. In this case, the electrostatic capacitance of the first parallel resonator can be easily differentiated from the electrostatic capacitance of the second parallel resonator merely by differentiating the IDT electrode in the first parallel resonator from the IDT electrode in the second parallel resonator. Furthermore, in order to differentiate the electrostatic capacitance of the first parallel resonator from the electrostatic capacitance of the second parallel resonator, the IDT electrode in the first parallel resonator may be differentiated from the IDT electrode in the second parallel resonator in at least one of the number of pairs of electrode fingers, the opposing length, and the duty ratio of electrode fingers in the IDT electrode.

In another specific aspect of the acoustic wave filter device according to a preferred embodiment of the present invention, each of the first and second parallel resonators preferably includes a piezoelectric thin film resonator including a piezoelectric thin film and first and second resonant electrodes. The first resonant electrode is arranged so as to oppose the second resonant electrode with the piezoelectric thin film sandwiched therebetween. In the above manner, the resonator defining the parallel resonator is not restricted to the acoustic wave resonator and a piezoelectric thin film resonator may be used as the resonator defining the parallel resonator. When each of the first and second parallel resonators is defined by a piezoelectric thin film resonator, it is possible to easily differentiate the electrostatic capacitance of the first parallel resonator from the electrostatic capacitance of the second parallel resonator by, for example, differentiating the first resonant electrode from the second resonant electrode in the opposing area in the first and second parallel resonators.

In a preferred embodiment of the present invention, a surface acoustic wave may preferably be used as the acoustic wave. In this case, an acoustic wave filter device according to a preferred embodiment of the present invention, includes longitudinally coupled resonator-surface acoustic wave filters. Alternatively, a boundary acoustic wave may be used as the acoustic wave. In this case, an acoustic wave filter device according to a preferred embodiment of present invention, includes longitudinally coupled resonator-boundary acoustic wave filters.

According to various preferred embodiments of the present invention, in the acoustic wave filter device including an unbalanced terminal; first and second balanced terminals; longitudinally coupled resonator-acoustic wave filters that are connected between the unbalanced terminal and the first balanced terminal and between the unbalanced terminal and the second balanced terminal and that has the balanced-unbalanced conversion function; and first and second parallel resonators connected between the first balanced terminal and a ground potential and between the second parallel resonator and the ground potential, respectively, since the first parallel resonator is differentiated from the second parallel resonator in the electrostatic capacitance, it is possible to increase the amount of attenuation in the attenuation band near the pass band. And, when the acoustic wave filter device is used as the reception filter of a duplexer, it is possible to improve the isolation characteristics. In addition, since the wavelength of the parallel resonator having a relatively small electrostatic capacitance is preferably shorter than the wavelength of the remaining parallel resonator in the first and second parallel resonators, a degradation in the sharpness of the filter characteristics at the lower side of the pass band is prevented. Accordingly, when the acoustic wave filter device is used as the reception filter of a duplexer, it is possible to increase the amount of attenuation in the transmission pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will herein be described with reference to the attached drawings to disclose the present invention.

Figure 1:
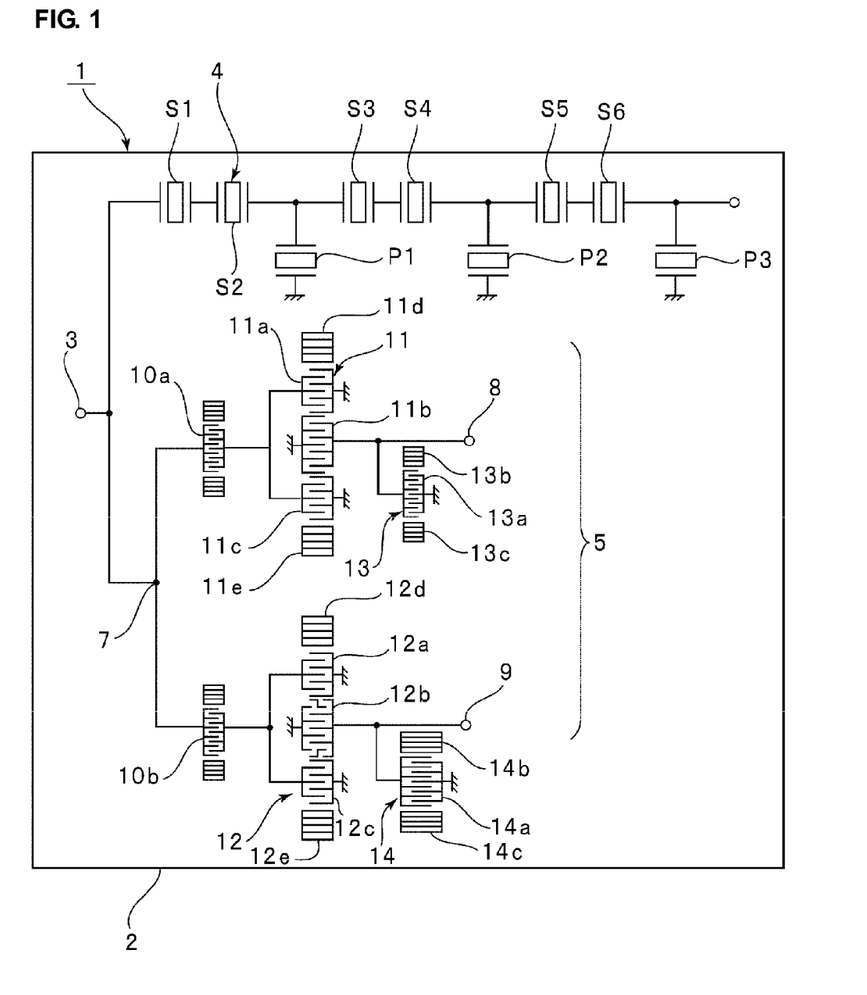
FIG. 1 is a schematic view illustrating a circuit configuration of a duplexer provided with an acoustic wave filter device according to a preferred embodiment of the present invention.

FIG. 1 illustrates a circuit configuration of a duplexer provided with an acoustic wave filter device according to a preferred embodiment of the present invention.

A duplexer 1 is provided by realizing the circuit configuration in FIG. 1 on a piezoelectric substrate 2. The structure of electrodes and circuit elements are schematically illustrated in FIG. 1.

The duplexer 1 includes an antenna terminal 3 connected to an antenna. A transmission filter 4 and a reception filter 5 are connected to the antenna terminal 3. The duplexer 1 preferably is a UMTS-BAND 8 duplexer and is preferably used in a mobile phone. In the UMTS-BAND 8, the transmission pass band is from 880 MHz to 915 MHz and the reception pass band is from 925 MHz to 960 MHz.

The transmission filter 4 preferably is a ladder-type surface acoustic wave filter including multiple series arm resonators S1 to S6 and multiple parallel arm resonators P1 to P3. Each of the series arm resonators S1 to S6 and the parallel arm resonators P1 to P3 is a surface acoustic wave resonator including an IDT electrode and a pair of reflectors provided on the piezoelectric substrate 2.

The circuit configuration of the transmission filter 4 and the configuration of each resonator defining the transmission filter 4 are not restricted to the above ones.

The reception filter 5 is an acoustic wave filter device according to a preferred embodiment of the present invention. The reception filter 5 includes an unbalanced terminal 7 connected to the antenna terminal 3 and first and second balanced terminals 8 and 9 and has the balanced-unbalanced conversion function. The first and second balanced terminals 8 and 9 are connected to reception terminals of the duplexer 1.

The input impedance in the unbalanced terminal 7 is equal to about 50 Ω and the output impedance in the first and second balanced terminals 8 and 9 is equal to about 100 Ω, for example.

In the present preferred embodiment, an X-propagation $LiTaO_3$ substrate that is Y-cut at 40±5° is preferably used as the piezoelectric substrate 2, for example. The piezoelectric substrate 2 may be formed of a $LiTaO_3$ substrate having another crystal orientation or another piezoelectric single crystal substrate, such as a $LiNbO_3$ substrate. Alternatively, a piezoelectric substrate made of piezoelectric ceramics may be used as the piezoelectric substrate 2.

In the reception filter 5, the structure of electrode illustrated in FIG. 1 is provided on the piezoelectric substrate 2. The electrodes in the structure are preferably made of Al, for example. However, the material of the electrodes is not restricted to Al and may be AL alloy, another metal such as Au, Cu, or W other than Al, or another alloy. Each of the electrodes includes a layered metal film in which multiple metal films are layered, for example.

A first longitudinally coupled resonator-acoustic wave filter 11 and a first series resonator 10a connected in series to the first longitudinally coupled resonator-acoustic wave filter 11 are connected between the unbalanced terminal 7 and the first balanced terminal 8. In other words, the first longitudinally coupled resonator-acoustic wave filter 11 is connected to the unbalanced terminal 7 via the first series resonator 10a. A first parallel resonator 13 is connected between the first balanced terminal 8 and a ground potential. In other words, the first parallel resonator 13 is connected in parallel to the first longitudinally coupled resonator-acoustic wave filter 11.

The first series resonator 10a is a one-port surface acoustic wave resonator and includes an IDT electrode and a pair of reflectors arranged on both side of the IDT electrode in a direction in which surface acoustic waves are propagated. Similarly, the first parallel resonator 13 is a one-port surface acoustic wave resonator including an IDT electrode 13a and a pair of reflectors 13b and 13c arranged on both side of the IDT electrode 13a in the direction in which surface acoustic waves are propagated.

The first longitudinally coupled resonator-acoustic wave filter 11 is a three-IDT-type longitudinally coupled resonator-surface acoustic wave filter including IDT electrodes 11a to 11c arranged along the direction in which surface acoustic waves are propagated and a pair of reflectors 11d and 11e arranged on both side of the area where the IDT electrodes 11a to 11c are provided in the direction in which surface acoustic waves are propagated.

Although not illustrated in FIG. 1, in each of the IDT electrodes 11a to 11c, a narrow-pitch electrode finger portion having an electrode finger pitch narrower than that of the remaining portion of the IDT electrode is preferably provided in a portion where the IDT electrodes are adjacent to each other.

One end of each of the IDT electrodes 11a and 11c is connected to the unbalanced terminal 7 via the first series resonator 10a. One end of the IDT electrode 11b is connected to the first balanced terminal 8. The other ends of the IDT electrodes 11a to 11c are all grounded.

A second longitudinally coupled resonator-acoustic wave filter 12 and a second series resonator 10b connected in series to the second longitudinally coupled resonator-acoustic wave filter 12 are connected between the unbalanced terminal 7 and the second balanced terminal 9. In other words, the second longitudinally coupled resonator-acoustic wave filter 12 is connected to the unbalanced terminal 7 via the second series resonator 10b. A second parallel resonator 14 is connected between the second balanced terminal 9 and the ground potential. In other words, the second parallel resonator 14 is connected in parallel to the second longitudinally coupled resonator-acoustic wave filter 12.

The second parallel resonator 14 is a one-port surface acoustic wave resonator, like the first parallel resonator 13. The second parallel resonator 14 includes an IDT electrode 14a and a pair of reflectors 14b and 14c arranged on both sides of the IDT electrode 14a in the direction in which surface acoustic waves are propagated. The second series resonator 10b is a one-port surface acoustic wave resonator, like the first series resonator 10a. The second series resonator 10b includes an IDT electrode and a pair of reflectors arranged on both sides of the IDT electrode in the direction in which surface acoustic waves are propagated.

The second longitudinally coupled resonator-acoustic wave filter 12, which is configured in approximately the same manner as in the first longitudinally coupled resonator-acoustic wave filter 11, is a three-IDT-type longitudinally coupled resonator-surface acoustic wave filter including IDT electrodes 12a to 12c arranged along the direction in which surface acoustic waves are propagated and a pair of reflectors 12d and 12e arranged on both sides of the area where the IDT electrodes 12a to 12c are provided in the direction in which surface acoustic waves are propagated. One end of each of the IDT electrodes 12a to 12c is connected to the unbalanced terminal 7 via the second series resonator 10b. One end of the IDT electrode 12b is connected to the second balanced terminal 9. The other ends of the IDT electrodes 12a to 12c are all grounded.

The second longitudinally coupled resonator-acoustic wave filter 12 differs from the first longitudinally coupled resonator-acoustic wave filter 11 in that series weighting is performed in the IDT electrode 12b and in that the IDT electrodes 12a to 12c are arranged so that the phase of a signal supplied to the second balanced terminal 9 is different from the phase of a signal supplied to the first balanced terminal 8 by 180 degrees.

The series weighting means that the following floating electrode finger portion is provided at the ends of an IDT electrode. Specifically, the floating electrode finger portion includes a first electrode finger portion that is arranged so as to oppose the leading end of the outermost electrode finger of the IDT electrode with a gap and that is extended in the direction in which the electrode finger extends, a second electrode finger portion that is arranged so as to oppose the leading edge of the electrode finger inwardly adjacent to the outermost electrode finger of the IDT electrode with a gap and that is extended in the direction in which the electrode finger extends, and a third electrode finger portion that is connected to the first and second electrode finger portions and that extends in the direction in which surface acoustic waves are propagated. The first electrode finger portion in the floating electrode finger portion is arranged at a position that is overlapped with the electrode finger adjacent to the outermost electrode finger of the IDT electrode in the direction in which surface acoustic waves are propagated. The second electrode finger portion in the floating electrode finger portion is arranged at a position that is overlapped with the outermost electrode finger of the IDT electrode in the direction in which surface acoustic waves are propagated.

The resonant frequencies of the first and second series resonators 10a and 10b are positioned within the pass band, that is, within the reception pass band (Rx bandwidth) of the reception filter 5. The anti-resonant frequencies of the first and second series resonators 10a and 10b are positioned in the attenuation band at the higher side of the Rx bandwidth of the reception filter 5. The presence of the first and second series resonators 10a and 10b allows the amount of attenuation in the attenuation band at the higher side of the Rx bandwidth of the reception filter 5 to be increased.

The anti-resonant frequencies of the first and second parallel resonators 13 and 14 are positioned within the pass band, that is, within the reception pass band (Rx bandwidth) of the reception filter 5. The resonant frequencies of the first and second parallel resonators 13 and 14 are positioned in the attenuation band at the lower side of the Rx bandwidth of the reception filter 5. The presence of the first and second parallel resonators 13 and 14 allows the amount of attenuation in the attenuation band at the lower side of the Rx bandwidth of the reception filter 5 to be increased.

In addition, in the present preferred embodiment, the first parallel resonator 13 is different from the second parallel resonator 14 in the electrostatic capacitance. Specifically, the IDT electrode 13a in the first parallel resonator 13 is differentiated from the IDT electrode 14a in the second parallel resonator 14 in at least one of the number of pairs of electrode fingers, the opposing length, and the duty ratio of the electrode fingers of the IDT electrode to differentiate the electrostatic capacitance of the first parallel resonator 13 from the electrostatic capacitance of the second parallel resonator 14.

Specifically, in the present preferred embodiment, the electrostatic capacitance of the first parallel resonator 13 is preferably smaller than the electrostatic capacitance of the second parallel resonator 14. This increases the amount of attenuation in the pass band of the transmission filter 4 in the reception filter 5 and improves the isolation characteristics of the reception filter 5 relative to the transmission filter 4. In addition, the wavelength defined by the electrode finger pitch of the IDT electrode 13a in the first parallel resonator 13 having a relatively smaller electrostatic capacitance is preferably shorter than the wavelength defined by the electrode finger pitch of the IDT electrode 14a in the second parallel resonator 14. This prevents a variation in the impedance. Accordingly, it is possible to prevent a degradation of the sharpness of the filter characteristics at the lower side of the pass band of the reception filter 5. This will now be described on the basis of specific experimental examples.

Specifications of the First Longitudinally Coupled Resonator-Acoustic Wave Filter 11

The wavelength defined by the electrode finger pitch in the electrode finger portion excluding the narrow-pitch electrode finger portion of each of the IDT electrodes 11a to 11c is denoted by λI.

Opposing Length of the IDT Electrodes 11a to 11c: 30.6 λI

The number of electrode fingers of each of the IDT electrodes 11a to 11c: 39. However, in each of the IDT electrodes 11a and 11c, the narrow-pitch electrode finger portion is provided at the portion adjacent to the IDT electrode 11b and, among the 39 electrode fingers, the number of the electrode fingers in the narrow-pitch electrode finger portion is equal to four and the number of the electrode fingers in the remaining electrode finger portion is equal to 35.

The number of electrode fingers of the IDT electrode 11b: 39. However, in the IDT electrode 11b, the narrow-pitch electrode finger portion having four electrode fingers is provided at each of the portions adjacent to the IDT electrodes 11a and 11c and the number of the electrode fingers in the remaining electrode finger portion is equal to 31.

The number of electrode fingers of the reflectors 11d/11e: 75

Metallization ratio: 0.70

Electrode thickness: 0.087 λI

The second longitudinally coupled resonator-acoustic wave filter 12 is similar to the first longitudinally coupled resonator-acoustic wave filter 11 except that the orientation of the IDT electrode 12b is inverted with respect to that of the IDT electrode 11b and the series weighting is performed.

Specifications of the First and Second Series Resonators 10a and 10b

The wavelength defined by the electrode finger pitch of the IDT electrode is denoted by λIa.

Opposing length of the IDT electrode: 15.4 λIa

The number of electrode fingers of the IDT electrode: 98

The number of electrode fingers of the reflectors: 18

Metallization ratio: 0.60

Electrode thickness: 0.089 λIa

Specifications of the First and Second Parallel Resonators 13 and 14

The wavelength defined by the electrode finger pitch of the IDT electrode is denoted by λIb.

The number of electrode fingers of the IDT electrode: 111

The number of electrode fingers of the reflectors: 18

Metallization ratio: 0.60

Electrode thickness: 0.086 λIb

Difference Between the First and Second Parallel Resonators 13 and 14

The wavelength λIb defined by the electrode finger pitch of the IDT electrode 13a in the first parallel resonator 13 was set to about 4.2653 μm and the wavelength λIb defined by the electrode finger pitch of the IDT electrode 14a in the second parallel resonator 14 was set to about 4.2683 μm, for example. In other words, the wavelength defined by the electrode finger pitch of the IDT electrode 13a in the first parallel resonator 13 was made shorter than the wavelength defined by the electrode finger pitch of the IDT electrode 14a in the second parallel resonator 14 to make the resonant frequency of the first parallel resonator 13 relatively high.

In addition, the opposing length of the IDT electrode 13a in the first parallel resonator 13 was set to about 7.7 λIb and the opposing length of the IDT electrode 14a in the second parallel resonator 14 was set to about 12.9 λIb, for example. In the above manner, in the first parallel resonator 13 and the second parallel resonator 14, the electrostatic capacitance of the first parallel resonator 13 was made relatively small and the wavelength λIb defined by the electrode finger pitch of the IDT electrode in the first parallel resonator 13 was made relatively short.

As a first comparative example, a duplexer was manufactured in the same manner as in the present preferred embodiment except that the wavelength λIb defined by the electrode finger pitch of the IDT electrode in each of the first and second parallel resonators was set to 4.2668 μm and the opposing length of the IDT electrode in each of the first and second parallel resonators was set to 10.3 λI.

Figure 2:
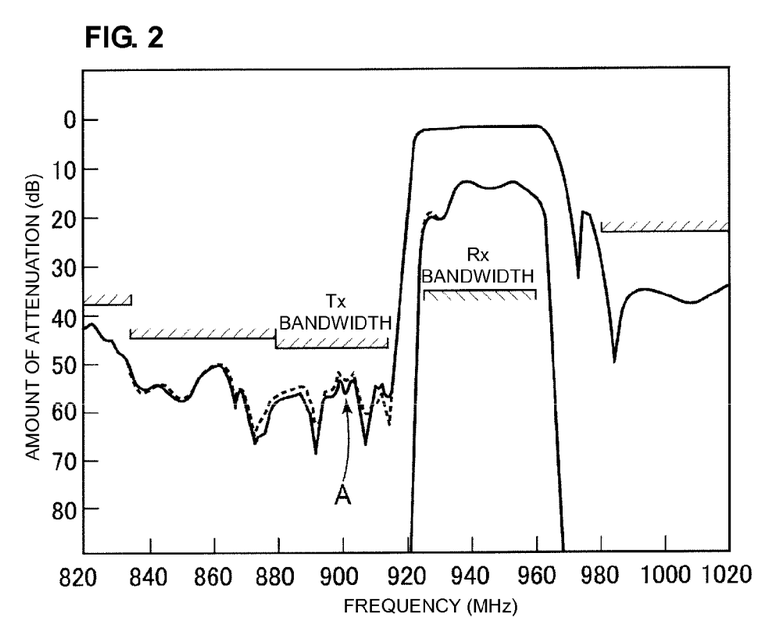
FIG. 2 illustrates attenuation frequency characteristics of the acoustic wave filter device, which is a reception filter in the duplexer of the present preferred embodiment, and of an acoustic wave filter device, which is a reception filter in a duplexer in a first comparative example.
Figure 3:
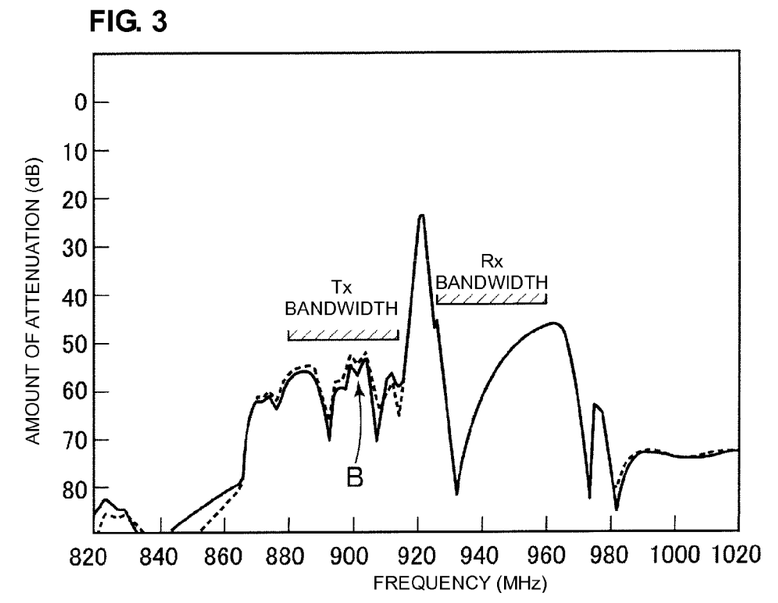
FIG. 3 illustrates isolation characteristics in a transmission pass band (Tx bandwidth) of the acoustic wave filter device, which is the reception filter in the duplexer of the present preferred embodiment, and of the acoustic wave filter device, which is the reception filter in the duplexer in the first comparative example.

FIG. 2 illustrates attenuation frequency characteristics of the acoustic wave filter device, which is the reception filter in the duplexer of the present preferred embodiment, and of the acoustic wave filter device, which is the reception filter in the duplexer in the first comparative example. FIG. 3 illustrates isolation characteristics in the transmission pass band (Tx bandwidth) of the acoustic wave filter device, which is the reception filter in the duplexer of the present preferred embodiment, and of the acoustic wave filter device, which is the reception filter in the duplexer in the first comparative example.

Referring to FIG. 2 and FIG. 3, solid lines denote the results of the present preferred embodiment and broken lines denote the results of the first comparative example.

As apparent from the position indicated by an arrow A in FIG. 2, according to the present preferred embodiment, the amount of attenuation in the transmission pass band (Tx bandwidth) is improved by about 2.1 dB, compared with the first comparative example. Similarly, as apparent from the position indicated by an arrow B in FIG. 3, according to the present preferred embodiment, the isolation in the transmission pass band (Tx bandwidth) is also improved by about 2.1 dB, compared with the first comparative example.

As described above, in the acoustic wave filter device serving as the reception filter 5, making the electrostatic capacitance of the first parallel resonator 13 smaller than the electrostatic capacitance of the second parallel resonator 14 and making the waveform in the first parallel resonator 13 shorter than the wavelength in the second parallel resonator 14 allow the amount of attenuation in the transmission pass band and the isolation characteristics to be improved. The reason for this will now be described.

Figure 4:
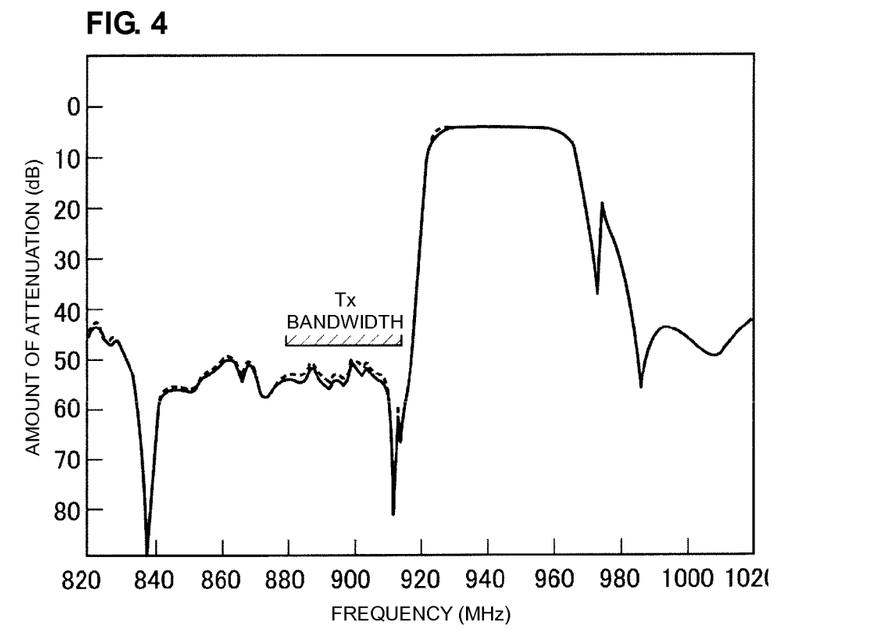
FIG. 4 illustrates an attenuation frequency characteristic in a first balanced terminal of each of the acoustic wave filter device, which is the reception filter in the duplexer of the present preferred embodiment, and the acoustic wave filter device, which is the reception filter in the duplexer in the first comparative example.
Figure 5:
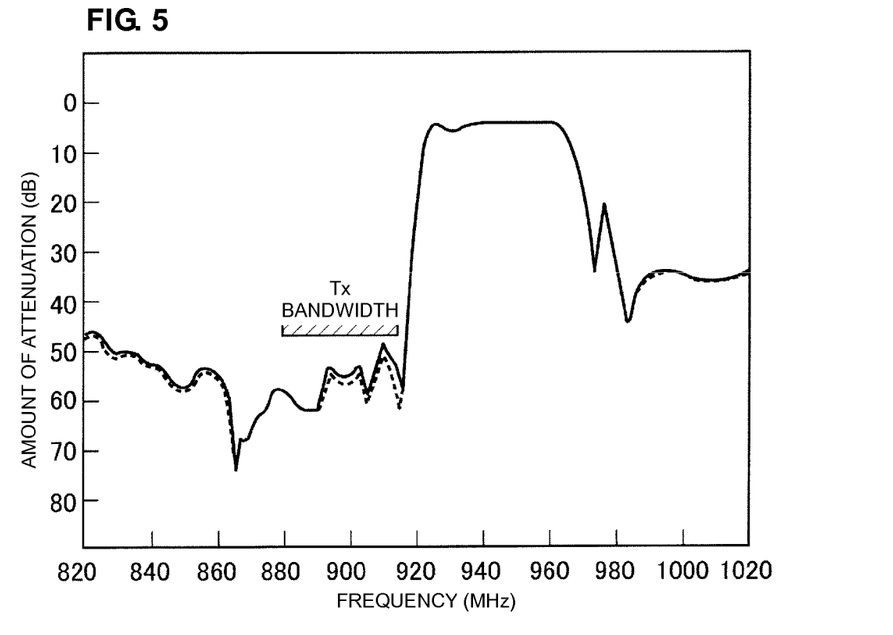
FIG. 5 illustrates an attenuation frequency characteristic in a second balanced terminal of each of the acoustic wave filter device, which is the reception filter in the duplexer of the present preferred embodiment, and the acoustic wave filter device, which is the reception filter in the duplexer in the first comparative example.

FIG. 4 illustrates an attenuation frequency characteristic in the first balanced terminal of each of the acoustic wave filter device, which is the reception filter in the duplexer of the present preferred embodiment, and the acoustic wave filter device, which is the reception filter in the duplexer in the first comparative example. FIG. 5 illustrates an attenuation frequency characteristic in the second balanced terminal of each of the acoustic wave filter device, which is the reception filter in the duplexer of the present preferred embodiment, and the acoustic wave filter device, which is the reception filter in the duplexer in the first comparative example. Referring to FIG. 4 and FIG. 5, solid lines denote the results of the present preferred embodiment and broken lines denote the results of the first comparative example.

As apparent from FIG. 4, in the attenuation frequency characteristic extracted from the first balanced terminal 8 of the acoustic wave filter device, which is the reception filter 5 in the duplexer 1 of the present preferred embodiment, the amount of attenuation in the transmission pass band is larger than that in the first comparative example. In contrast, in the attenuation frequency characteristic extracted from the second balanced terminal 9 of the acoustic wave filter device, which is the reception filter 5 in the duplexer 1 of the present preferred embodiment, the amount of attenuation in the transmission pass band is smaller than that in the first comparative example. Accordingly, the difference in the attenuation frequency characteristic between the first balanced terminal 8 and the second balanced terminal 9 in the transmission pass band (880 MHz to 905 MHz) in the present preferred embodiment is smaller than that in the first comparative example. This is realized by differentiating the electrostatic capacitance of the first parallel resonator 13 from the electrostatic capacitance of the second parallel resonator 14. The level of the amount of attenuation in the transmission pass band between the first and second balanced terminals 8 and 9 is adjusted in accordance with the difference in the electrostatic capacitance in order to improve the amount of attenuation in the transmission pass band and to improve the isolation characteristics in balanced output.

Next, the manner in which the wavelength λIb defined by the electrode finger pitch of the IDT electrode is differentiated between the first parallel resonator 13 and the second parallel resonator 14 will now be described.

Figure 6:
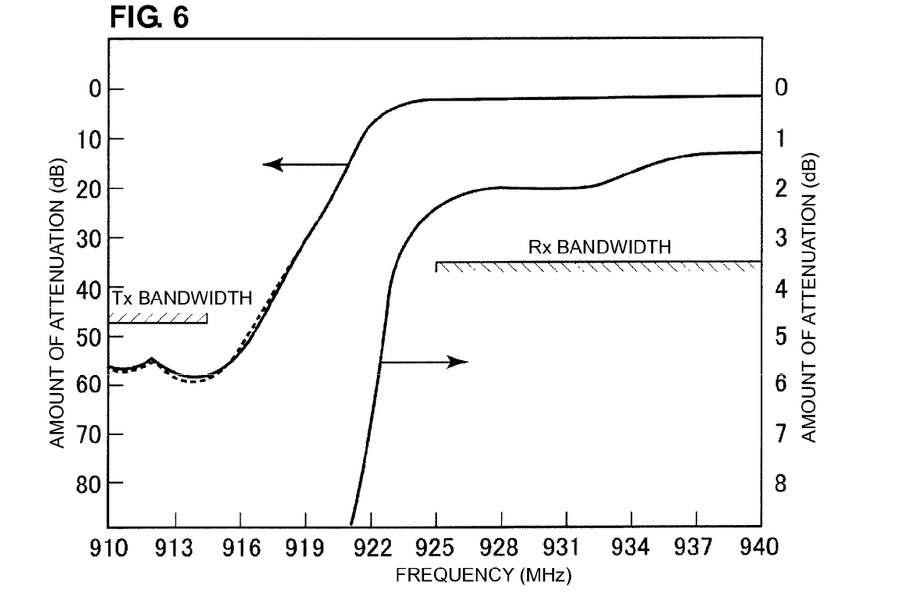
FIG. 6 illustrates attenuation frequency characteristics of the acoustic wave filter device, which is the reception filter in the duplexer of the present preferred embodiment, and of an acoustic wave filter device, which is a reception filter in a duplexer in a second comparative example.
Figure 7:
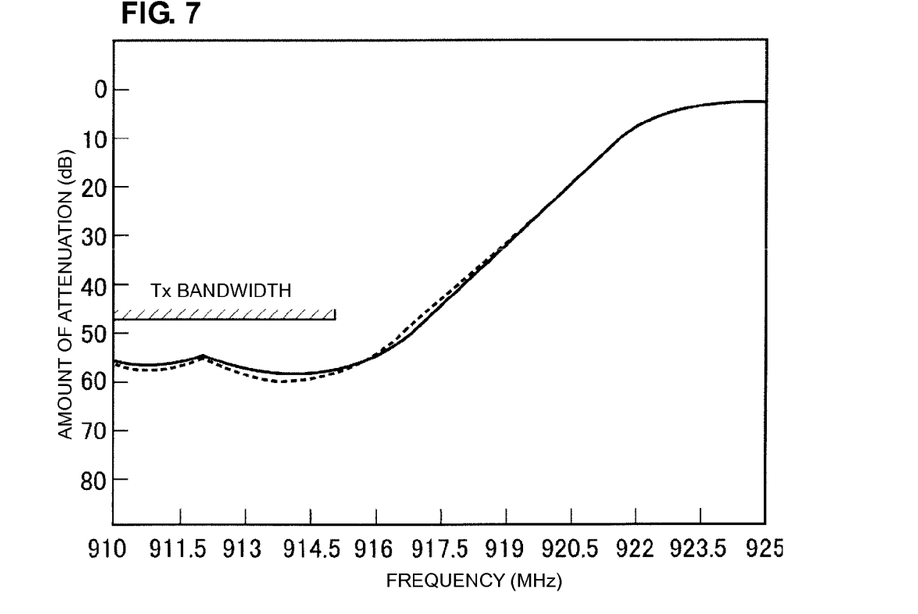
FIG. 7 is an enlarged diagram of a portion of the attenuation frequency characteristics illustrated in FIG. 6.

FIG. 6 illustrates attenuation frequency characteristics of the acoustic wave filter device, which is the reception filter in the duplexer of the present preferred embodiment, and of the acoustic wave filter device, which is a reception filter in a duplexer in a second comparative example. FIG. 7 is an enlarged diagram of a portion of the attenuation frequency characteristics illustrated in FIG. 6. Referring to FIG. 6 and FIG. 7, solid lines denote the results of the present preferred embodiment and broken lines denote the results of the second comparative example. In the second comparative example, the opposing lengths of the first and second parallel resonators were set to 7.7 λIb and 12.9 λIb, respectively, and thus the opposing length of the first parallel resonator is differentiated from that of the second parallel resonator, as in the present preferred embodiment, whereas the wavelength λIb defined by the electrode finger pitch of the IDT electrode was set to about 4.2668 μm in both of the first and second parallel resonators. In other words, the second comparative example differs from the present preferred embodiment only in that the wavelength λIb defined by the electrode finger pitch of the IDT electrode in the first parallel resonator 13 is equal to that in the second parallel resonator 14.

As apparent from FIG. 6 and FIG. 7, in the second comparative example, the frequency interval between the frequency position where the amount of attenuation is equal to 3.5 dB and the frequency position where the amount of attenuation is equal to 47 dB is longer than that in the present preferred embodiment. In other words, the sharpness of the filter characteristic in the attenuation band at the lower side of the Rx bandwidth is degraded. More specifically, the above frequency interval in the second comparative example is longer than that in the present preferred embodiment by 0.4 MHz, thus degrading the sharpness.

Figure 8:
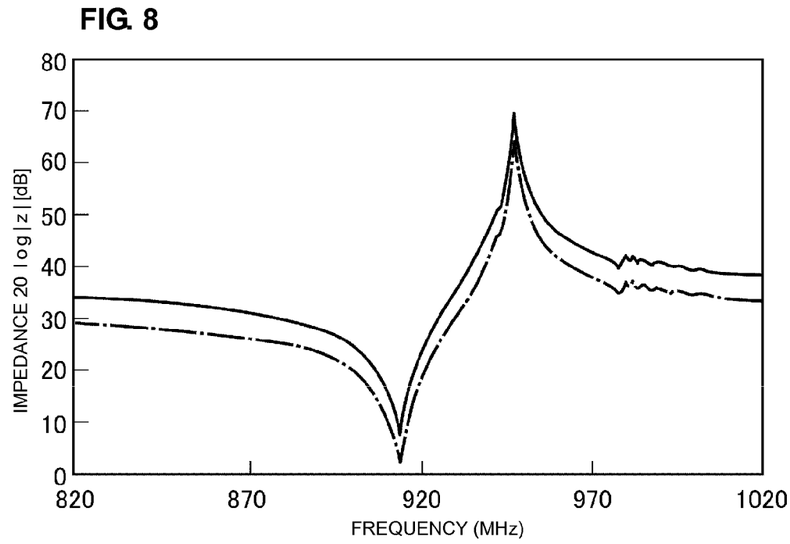
FIG. 8 illustrates impedance characteristics of a first parallel resonator and a second parallel resonator in the present preferred embodiment.

Differentiating the opposing length of the IDT electrode between the first and second parallel resonators 13 and 14 causes the impedance between the resonant frequency and the anti-resonant frequency of the surface acoustic wave resonator in the first parallel resonator 13 to be shifted from that in the second parallel resonator 14. FIG. 8 illustrates an impedance characteristic of the first parallel resonator 13 and an impedance characteristic of the second parallel resonator 14 in the present preferred embodiment.

Referring to FIG. 8, a solid line denotes the impedance characteristic of the first parallel resonator 13 and an alternate long and short dash line denotes the impedance characteristic of the second parallel resonator 14.

As apparent from FIG. 8, the impedance characteristic of the first parallel resonator 13 is shifted from the impedance characteristic of the second parallel resonator 14. Accordingly, in the second comparative example, the shift in impedance causes a degradation in the sharpness of the filter characteristics at the lower side of the pass band.

In contrast, in the present preferred embodiment, the opposing lengths λIb of the IDT electrodes of the first parallel resonator 13 and the second parallel resonator 14 are adjusted in accordance with the difference in impedance between the first parallel resonator 13 and the second parallel resonator 14. In other words, the wavelength λIb in the first parallel resonator 13 having a relatively small electrostatic capacitance is made relatively shorter to decrease the difference in impedance between the first parallel resonator 13 and the second parallel resonator 14, thus ensuring the sharpness of the filter characteristics at the lower side of the pass band.

As described above, the wavelength λIb in the parallel resonator having a relatively small electrostatic capacitance can be made relatively shorter to decrease the difference in impedance between the first and second parallel resonators. This allows the sharpness of the filter characteristics at the lower side of the pass band to be ensured.

According to the present preferred embodiment, configuring the acoustic wave filter device that uses the longitudinally coupled resonator-surface acoustic wave filter and that has the balanced-unbalanced conversion function such that the first and second parallel resonators are connected to the first and second balanced terminals, respectively, achieves a larger amount of attenuation in the attenuation band and improves the isolation characteristics in the transmission pass band when the acoustic wave filter device is used as the reception filter of the duplexer. Furthermore, it is possible to ensure the sharpness of the filter characteristics at the lower side of the pass band.

In addition, in the present preferred embodiment, only the one-stage longitudinally coupled resonator-acoustic wave filters 11 and 12 are connected between the unbalanced terminal 7 and the first balanced terminal 8 and between the unbalanced terminal 7 and the second balanced terminal 9, respectively. Since a multi-stage configuration in which multiple longitudinally coupled resonator-acoustic wave filters are cascaded to each other is not adopted, it is possible to decrease the insertion loss in the pass band. However, a multi-stage longitudinally coupled resonator-surface acoustic wave filter in which multiple longitudinally coupled resonator-acoustic wave filters are cascaded to each other may be used in a preferred embodiment of the present invention, instead of the first and second longitudinally coupled resonator-acoustic wave filters 11 and 12, if an increase in the insertion loss is permitted.

Figure 9:
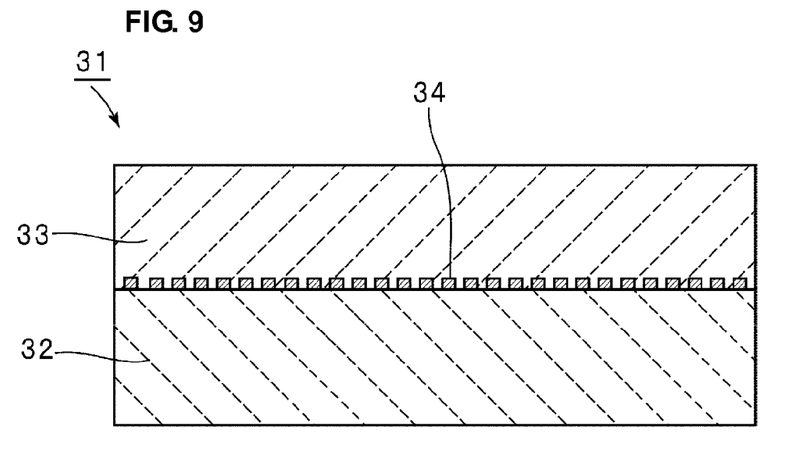
FIG. 9 is a schematic front cross-sectional view for describing the structure of a boundary acoustic wave filter device.

Furthermore, although the first and second longitudinally coupled resonator-acoustic wave filters 11 and 12 are preferably used in the present preferred embodiment, boundary acoustic wave filters may be used, instead of the surface acoustic wave filters. FIG. 9 is a schematic front cross-sectional view illustrating an example of a boundary acoustic wave filter. In a boundary acoustic wave filter 31, electrodes 34 including IDT electrodes are provided on the boundary surface between a piezoelectric substrate 32 and a dielectric body 33. Longitudinally coupled resonator-boundary acoustic wave filters using boundary acoustic waves propagated along the boundary surface between the piezoelectric substrate 2 and the dielectric body 33 may be provided as the first and second longitudinally coupled resonator-acoustic wave filters.

In addition, boundary acoustic wave resonators may be used, instead of the surface acoustic wave resonators, to form the first and second series resonators 10a and 10b and the first and second parallel resonators 13 and 14.

Furthermore, piezoelectric thin film resonators may preferably be used instead of the boundary acoustic wave resonators, to define the first and second series resonators 10a and 10b and the first and second parallel resonators 13 and 14.

Figure 10A:
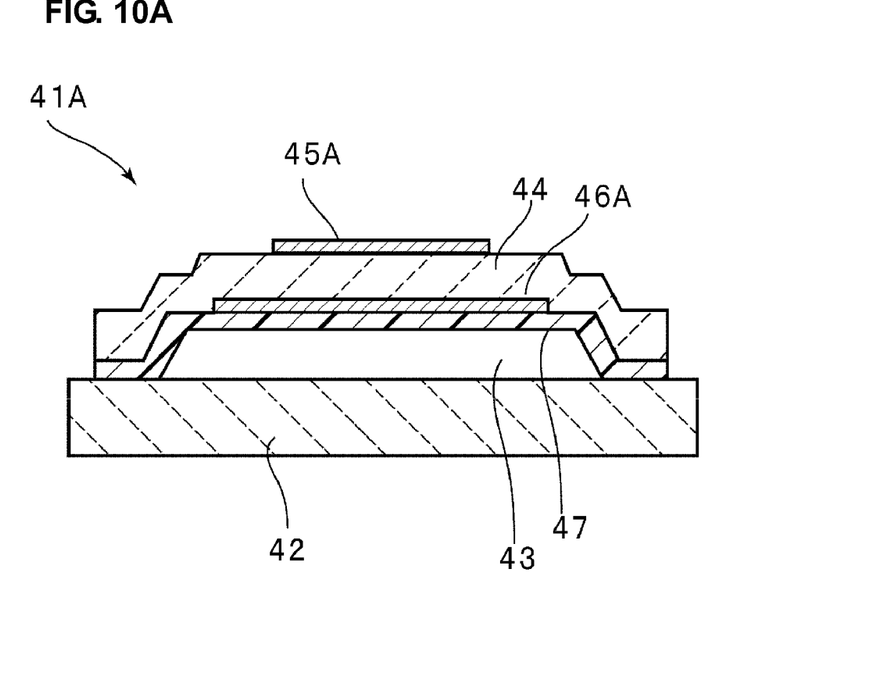
FIGS. 10A and 10B are schematic front cross-sectional views for describing piezoelectric thin film resonators used as the first and second parallel resonators.
Figure 10B:
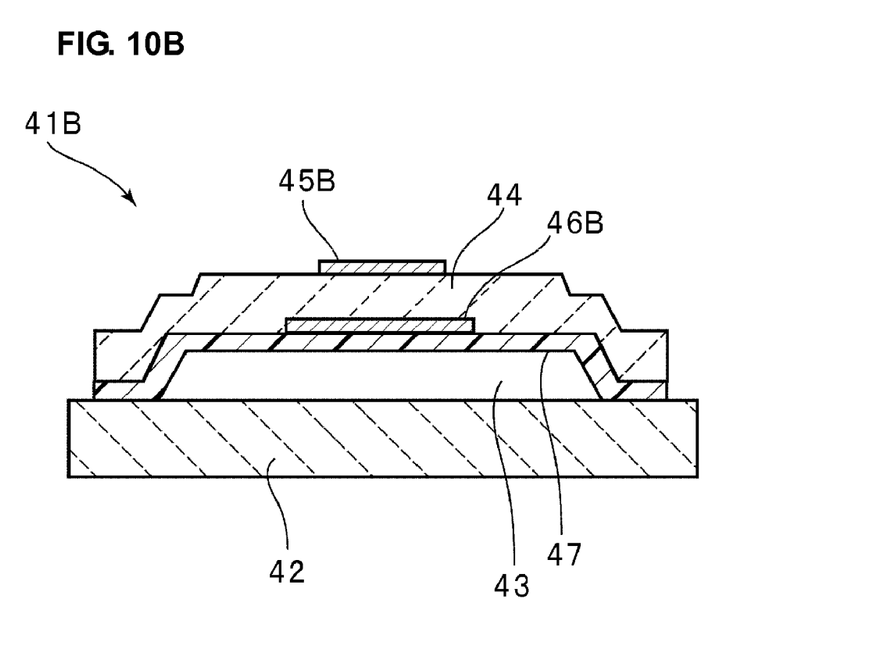

FIGS. 10A and 10B are schematic front cross-sectional views for describing the first and second parallel resonators, which are piezoelectric thin film resonators. As shown in FIG. 10A, in a piezoelectric thin film resonator 41A defining the first parallel resonator 13, first and second resonant electrodes 45A and 46A are provided on a substrate 42 so that the first resonant electrode 45A opposes the second resonant electrode 46A with a piezoelectric thin film 44 sandwiched therebetween. A support film 47 is arranged beneath the piezoelectric thin film 44 and the second resonant electrode 46A. The portion where the first resonant electrode 45A is overlapped with the second resonant electrode 46A via the piezoelectric thin film 44 is a piezoelectric transducer, and the piezoelectric transducer vibrates integrally with the support film 47. The piezoelectric transducer is in a state in which the piezoelectric transducer is floating from the substrate 42 via a gap 43. Similarly, as shown in FIG. 10B, also in a piezoelectric thin film resonator 41B defining the second parallel resonator 14, first and second resonant electrodes 45B and 46B are arranged on the substrate 42 so that the first resonant electrode 45B opposes the second resonant electrode 46B with the piezoelectric thin film 44 sandwiched therebetween. The support film 47 is arranged beneath the piezoelectric thin film 44 and the second resonant electrode 46B. The portion where the first resonant electrode 45B is overlapped with the second resonant electrode 46B via the piezoelectric thin film 44 is a piezoelectric transducer, and the piezoelectric transducer vibrates integrally with the support film 47. The piezoelectric transducer is in the state in which the piezoelectric transducer is floating from the substrate 42 via the gap 43. Differentiating the opposing area of the first and second resonant electrodes 45A and 46A of the piezoelectric thin film resonator 41A from the opposing area of the first and second resonant electrodes 45B and 46B of the piezoelectric thin film resonator 41B allows the electrostatic capacitance of the piezoelectric thin film resonator 41A to be differentiated from the electrostatic capacitance of the piezoelectric thin film resonator 41B. In addition, the piezoelectric thin film resonator 41A may be different from the piezoelectric thin film resonator 41B in the thickness of the piezoelectric thin film 44.

The wavelengths of the piezoelectric thin film resonators 41A and 41B can be adjusted by, for example, adjusting the thickness of the piezoelectric thin film 44, differentiating the material of the piezoelectric thin film 44 between the piezoelectric thin film resonator 41A and the piezoelectric thin film resonator 41B, or adding a damping material.

Although the acoustic wave filter device according to the present invention is preferably applied to the reception filter of the duplexer of a mobile phone in the above preferred embodiments and modification, the present invention is not restricted to the reception filter and can be used in various applications as a bandpass filter having the balanced-unbalanced conversion function.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
an unbalanced terminal;
first and second balanced terminals;
longitudinally coupled resonator-acoustic wave filters that are connected between the unbalanced terminal and the first balanced terminal and between the unbalanced terminal and the second balanced terminal and that have a balanced-unbalanced conversion function;
a first parallel resonator connected between the first balanced terminal and a ground potential; and
a second parallel resonator connected between the second balanced terminal and the ground potential; wherein
the electrostatic capacitance of the first parallel resonator is different from that of the second parallel resonator; and
among the first and second parallel resonators, a wavelength of the parallel resonator having a relatively small electrostatic capacitance is shorter than that of the parallel resonator having a relatively large electrostatic capacitance.

2. The acoustic wave filter device according to claim 1, wherein each of the longitudinally coupled resonator-acoustic wave filters is a one-stage longitudinally coupled resonator-acoustic wave filter.

3. The acoustic wave filter device according to claim 1, wherein each of the first and second parallel resonators is defined by a one-port acoustic wave resonator including an IDT electrode.

4. The acoustic wave filter device according to claim 3, wherein the IDT electrode in the first parallel resonator is differentiated from the IDT electrode in the second parallel resonator so that the electrostatic capacitance of the first parallel resonator is differentiated from the electrostatic capacitance of the second parallel resonator.

5. The acoustic wave filter device according to claim 4, wherein the IDT electrode in the first parallel resonator is differentiated from the IDT electrode in the second parallel resonator in at least one of a number of pairs of electrode fingers, an opposing length, and a duty ratio of electrode fingers in the IDT electrode.

6. The acoustic wave filter device according to claim 1, wherein each of the first and second parallel resonators is defined by a piezoelectric thin film resonator including a piezoelectric thin film and first and second resonant electrodes, the first resonant electrode being arranged so as to oppose the second resonant electrode with the piezoelectric thin film sandwiched therebetween.

7. The acoustic wave filter device according to claim 6, wherein the first resonant electrode is differentiated from the second resonant electrode in the opposing area in the first and second parallel resonators so that the electrostatic capacitance of the first parallel resonator is differentiated from the electrostatic capacitance of the second parallel resonator.

8. The acoustic wave filter device according to claim 1, wherein the acoustic wave is a surface acoustic wave and each of the longitudinally coupled resonator-acoustic wave filters is a longitudinally coupled resonator-surface acoustic wave filter.

9. The acoustic wave filter device according to claim 1, wherein the acoustic wave is a boundary acoustic wave and each of the longitudinally coupled resonator-acoustic wave filters is a longitudinally coupled resonator-boundary acoustic wave filter.

* * * * *